United States Patent
Sung et al.

[11] Patent Number: 6,163,047
[45] Date of Patent: Dec. 19, 2000

[54] METHOD OF FABRICATING A SELF ALIGNED CONTACT FOR A CAPACITOR OVER BITLINE, (COB), MEMORY CELL

[75] Inventors: Janmye Sung; Nicky Lu, both of Hsinchu, Taiwan

[73] Assignees: Vanguard International Semiconductor Corp.; Etron Technology, Inc., both of Hsin-Chu, Taiwan

[21] Appl. No.: 09/351,241

[22] Filed: Jul. 12, 1999

[51] Int. Cl.[7] .................................. H01L 21/8242
[52] U.S. Cl. ............................. 257/306; 438/253
[58] Field of Search .................. 257/306–311, 300; 438/238, 253–256, 393–399, 381

[56] References Cited

U.S. PATENT DOCUMENTS

| | | | |
|---|---|---|---|
| 5,134,086 | 7/1992 | Ahn | 437/52 |
| 5,369,048 | 11/1994 | Hsue | 437/52 |
| 5,409,855 | 4/1995 | Jun | 437/52 |
| 5,763,306 | 6/1998 | Tsai | 438/255 |
| 5,874,335 | 2/1999 | Jenq et al. | 438/253 |
| 5,933,726 | 2/1999 | Nishimura et al. | 438/254 |

*Primary Examiner*—Jey Tsai
*Attorney, Agent, or Firm*—George O. Saile; Stephen B. Ackerman

[57] ABSTRACT

A process for fabricating a capacitor over bitline, DRAM device, using a self-aligned contact opening, through, and between the bitline structures, and featuring the formation of insulator spacers, on the sidewall of the bitline structures, formed after the opening of the self-aligned contact, has been developed. The self-aligned contact opening, located through the bitline structures, allows an increase in DRAM cell density to be achieved. The formation of insulator spacers, on the sidewall of the bitline structures, formed after the opening of the self-aligned contact, in a silicon oxide layer, allows silicon oxide to be used as the spacer material, thus resulting in capacitance decrease when compared to counterparts fabricated using silicon nitride spacers.

28 Claims, 9 Drawing Sheets

METHOD OF FABRICATING A SELF ALIGNED CONTACT FOR A CAPACITOR OVER BITLINE, (COB), MEMORY CELL

BACKGROUND OF THE INVENTION (1) Field of the Invention

The present invention relates to methods used to fabricate semiconductor devices, and more specifically to a method used to fabricate a memory cell a with capacitor over bitline, (COB), structure, dynamic random access memory, (DRAM), device, on a semiconductor substrate.

(2) Description of the Prior Art

To obtain maximum DRAM density, a capacitor over bitline, (COB), design, for high density DRAM chips has been used. The conventional approach of forming the COB structure, is to first form a bitline structure, followed by the formation of insulator spacers on the sidewall of the bitline structures. A self-aligned contact, (SAC), opening, is then made in a first insulator layer, through, (or between), the bitline structures, exposing an underlying conductive plug, which in turn overlays the source/drain region, used to communicate with a subsequent, overlying capacitor structure. However the stage in which the SAC is opened in a silicon oxide layer, after the formation of insulator spacers on the sides of the bitline structures, requires silicon nitride be used as the material for the sidewall spacers, due to the high etch rate ratio of silicon oxide to silicon nitride, needed for the SAC dry etching procedure. The use of silicon nitride sidewall spacers, featuring a higher dielectric constant than silicon oxide, results in unwanted increased capacitance, and decreased performance, for the DRAM cell.

This invention will describe a DRAM cell in which a SAC opening, to an underlying source/drain region, is made through bitline structures, but prior to the formation of insulator spacers on the sidewall of the bitline structures. Therefore this novel sequence allows silicon oxide spacers, to be formed on the sidewall of the bitline structures, thus resulting in decreased bitline to capacitor capacitance, when compared to counterparts fabricated using silicon nitride spacers. In addition since the spacers are formed after the SAC opening, possible damage to the insulator sidewall spacers, during the SAC opening, is avoided. This in turn allows the use of thinner insulator spacers, offering the attractive option of narrowing the SAC opening, increasing device density. Prior art, such as Tsai, in U.S. Pat. No. 5,763,306, show a COB DRAM device, however that prior art does not show the use of silicon oxide spacers, formed on the sides of bitline structures, after the creation of the SAC opening.

SUMMARY OF THE INVENTION

It is an object of the invention to fabricate a DRAM cell in which the capacitor structure, is located over the bitline structure, or a capacitor over bitline, (COB), structure.

It is another object of this invention to form a self aligned contact, (SAC), opening, in a silicon oxide layer, through, (or between), bitline structures, prior to formation of insulator spacers, on the sides of the bitline structures.

It is still another object of this invention to form silicon oxide spacers, on the sidewall of the bitline structures, after the creation of the SAC opening.

In accordance with the present invention a method of fabricating a COB, DRAM structure, in which a SAC opening is made through bitline structures, followed by the formation of insulator spacers, on the sidewall of the bitline structures, is described. First polysilicon plug structures, are formed overlying and contacting, source/drain regions, in a semiconductor substrate, self-aligned to, and located between, silicon nitride encapsulated, word line structures. Silicon nitride capped, bitline structures, are next formed, in a direction normal to the underlying word lines structures, followed by deposition of a silicon oxide layer. A SAC opening is then made in the silicon oxide layer, through bitline structures, exposing the top surface of a first polysilicon plug structure, located between the silicon nitride encapsulated, word line structures. Silicon oxide spacers are then formed on the sides of the bitline structures, followed by the formation of second polysilicon plug structures, located between the bitline structures, now comprised with silicon oxide sidewall spacers, and overlying the first polysilicon plug structure. A capacitor structure is subsequently formed overlying, and contacting the second polysilicon plug structure, located between the bitline structures.

BRIEF DESCRIPTION OF THE DRAWINGS

The object and other advantages of this invention are described in the preferred embodiment with reference to the attached drawings that include.

DESCRIPTION OF THE PREFERRED EMBODIMENTS

Figure 1A:
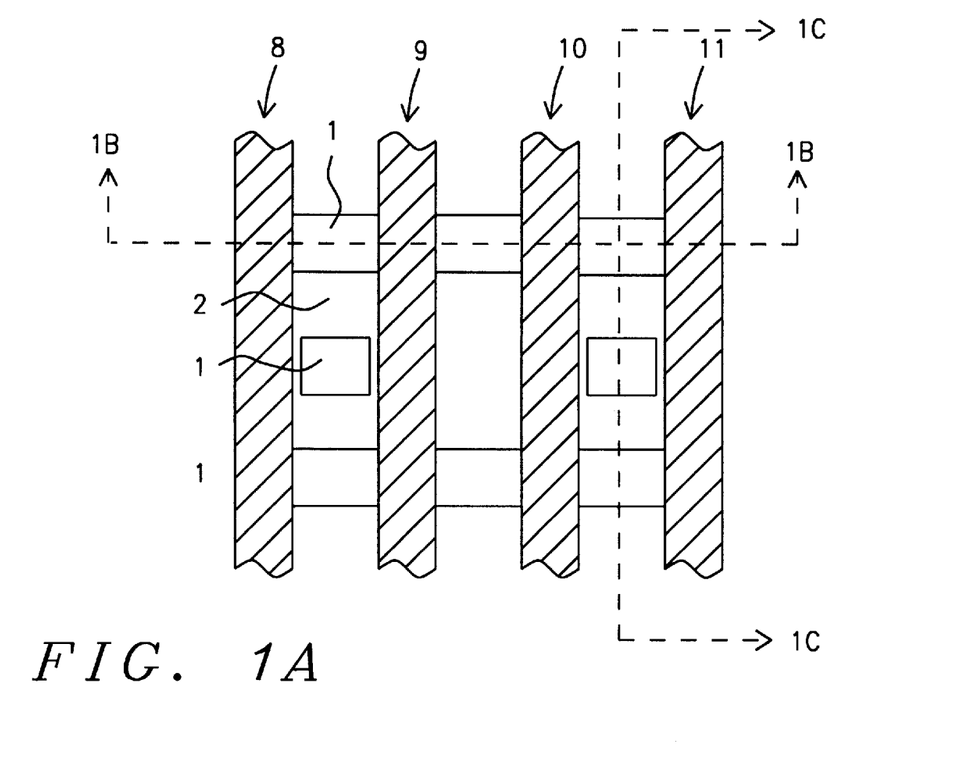
FIGS. 1A, 2A, 3A, and 4A, which schematically show the top view of the DRAM cell, at key stages of fabrication.

The method used to fabricate a COB DRAM device, on a semiconductor substrate, featuring the formation of a SAC opening, through bitline structures, and featuring insulator spacers, on the sides of the bitline structures, formed after the SAC opening, will now be described in detail. FIG. 1A, schematically shows a top view of the COB DRAM device, after fabrication of word line structures 8–11. Also shown in FIG. 1A, are shallow trench isolation regions 2, in semiconductor substrate 1. FIGS. 1B and 1C, again schematically show word line structures 8–11, this time in cross-sectional style. A semiconductor substrate 1, comprised of P type, single crystalline silicon, with a <100> crystallographic orientation is used. Shallow trench isolation, (STI), regions 2, are formed via first forming a shallow trench in semiconductor substrate 1, using conventional photolithographic and anisotropic, reactive ion etching, (RIE), procedures, using $Cl_2$ as an etchant for silicon. After removal of the photoresist shape used to define the shallow trenches, via plasma oxygen ashing and careful wet cleans, a silicon oxide layer is deposited, via low pressure chemical vapor deposition, (LPCVD), or plasma enhanced chemical vapor deposition, (PECVD), procedures, completely filling the shallow trenches. A chemical mechanical polishing, (CMP), procedure, or a selective RIE procedure, using $CHF_3$ as an etchant, is used to remove silicon oxide from the top surface of semiconductor substrate 1, resulting in the insulator filled, shallow trench isolation regions 2, schematically shown in FIGS. 1B and 1C.

Figure 1B:
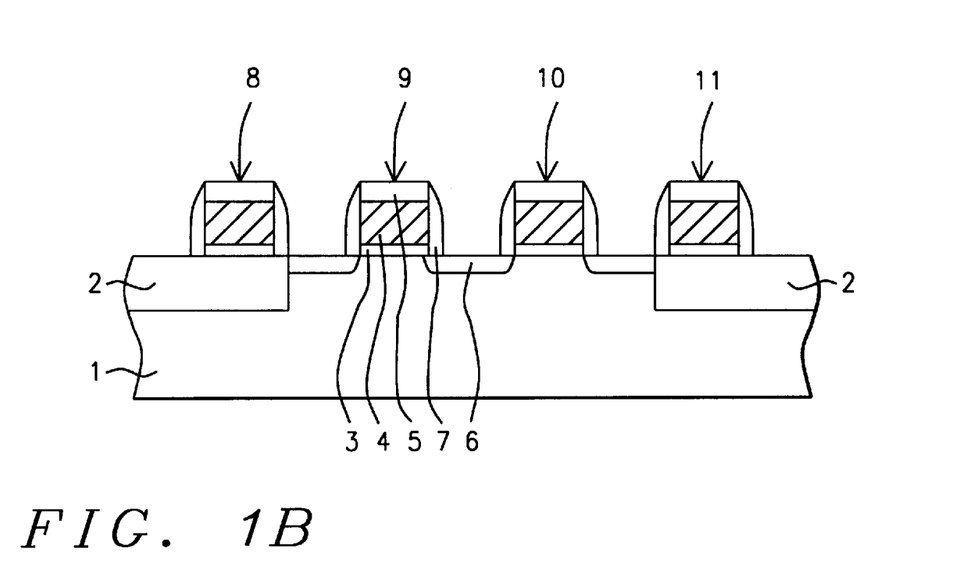
FIGS. 1B, 1C, 2B, 2C, 3B, 3C, 4B, 5A, 5B, 6A, 6B, 7A, 7B, and 8, which schematically, in cross-sectional style, describe key stages of fabrication, used to create a COB DRAM cell, in which a SAC opening is formed through the bitline structures, and with insulator spacers formed on the sides of the bitline structures, after the SAC opening procedure.
Figure 1C:
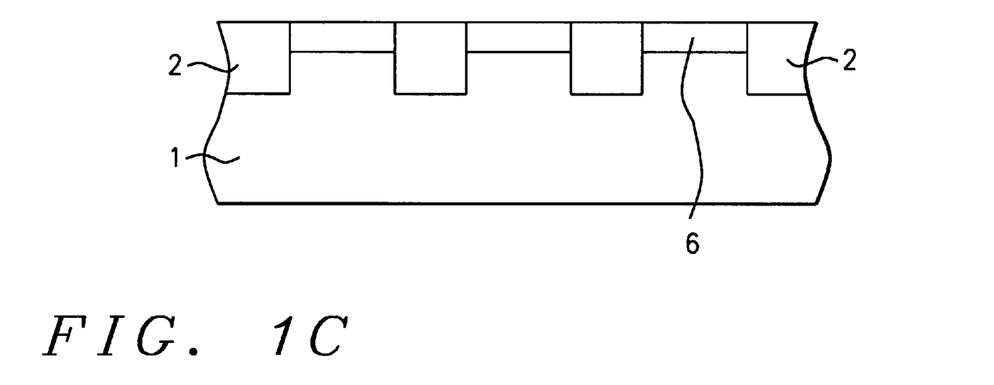

A gate insulator layer 3, shown schematically in FIGS. 1B and 1C, comprised of silicon dioxide, is thermally grown, in an oxygen—steam ambient, at a thickness between about 20 to 80 Angstroms. Polysilicon layer 4, is next deposited, via LPCVD procedures, to a thickness between about 800 to 4000 Angstroms. The polysilicon layer can be doped in situ, during deposition, via the addition of arsine, or phosphine, to a silane ambient, or the polysilicon layer 4, can be deposited intrinsically, then doped via an ion implantation procedure, using arsenic, or phosphorous ions. Silicon nitride layer 5, is then deposited via LPCVD or PECVD procedures, at a thickness between 500 to 3000 Angstroms. Conventional photolithographic and anisotropic RIE procedures, using $CF_4$ as an etchant for silicon nitride layer 5, and using $Cl_2$ as an etchant for polysilicon layer 4, are used to form word line structures 8–11, schematically shown in FIG. 1B. The photoresist shape used to define the word lines, is removed using plasma oxygen ashing and careful wet cleans. The regions of gate insulator 2, not covered by word line structures 8–11, are removed during the wet clean cycle, of the photoresist removal procedure. If desired, to decrease the resistance of word line structures 8–11, a polycide layer, comprised of tungsten silicide on polysilicon can be used to replace polysilicon layer 4. Lightly doped source/drain regions 6, shown schematically in FIGS. 1B and 1C, are next formed, in areas of semiconductor substrate 1, not covered by the word line structures. Lightly doped source/drain regions 6, are formed via ion implantation of arsenic or phosphorous ions, at an energy between about 20 to 80 KeV, at a dose between about 1E12 to 5E13 atoms/$cm^2$. Insulator spacers 7, comprised of silicon nitride, are next formed on the sides of word line structures 8–11, via deposition of a silicon nitride layer, via LPCVD or PECVD procedures, at a thickness between about 100 to 1000 Angstroms, followed by an anisotropic RIE procedure, using $CF_4$ as an etchant. Word line structures 8–11, are now encapsulated with silicon nitride, via capping silicon nitride layer 5, and via silicon nitride spacers 7. This is schematically shown in FIG. 1B.

Figure 2A:
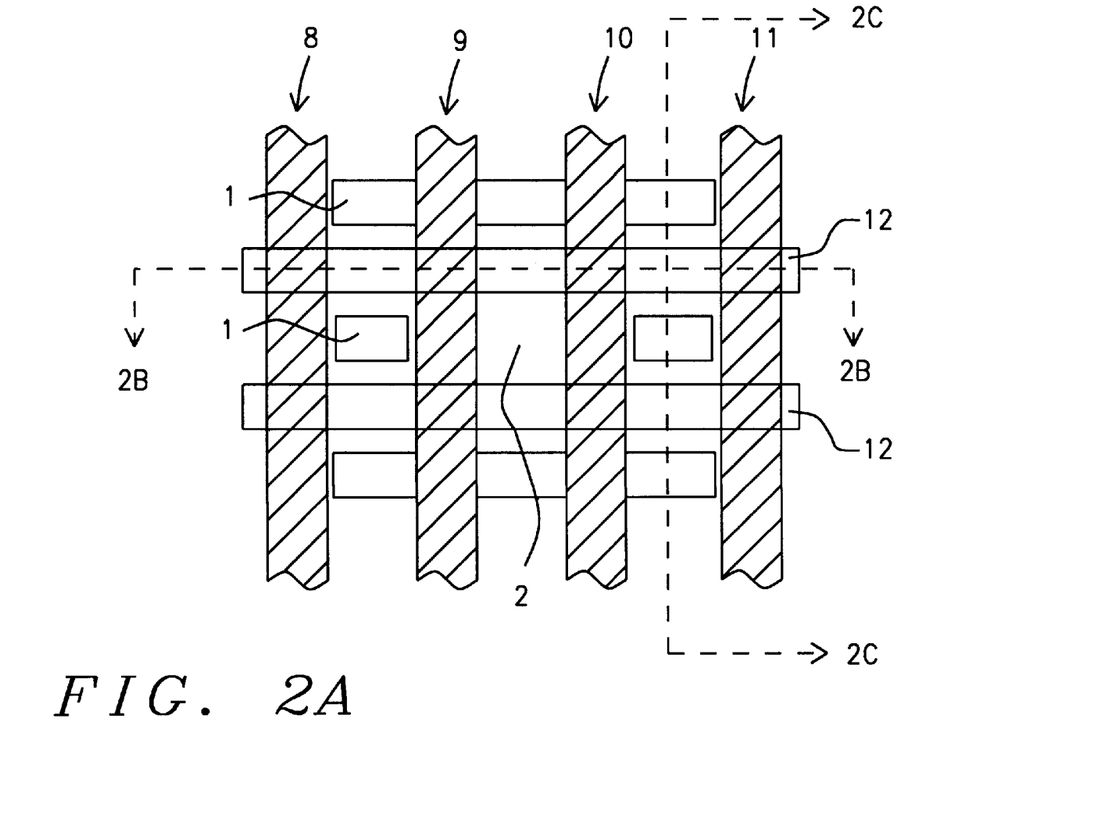
Figure 2B:
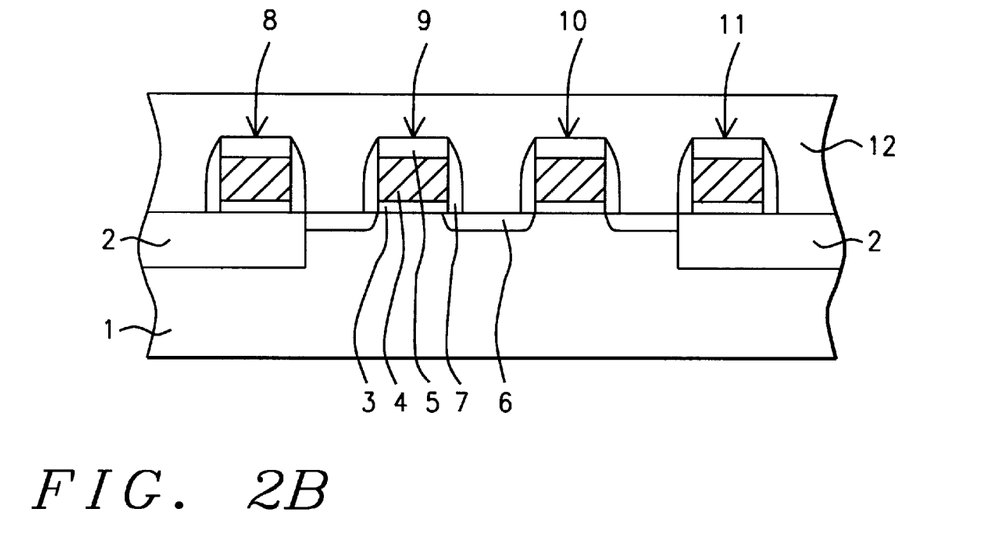
Figure 2C:
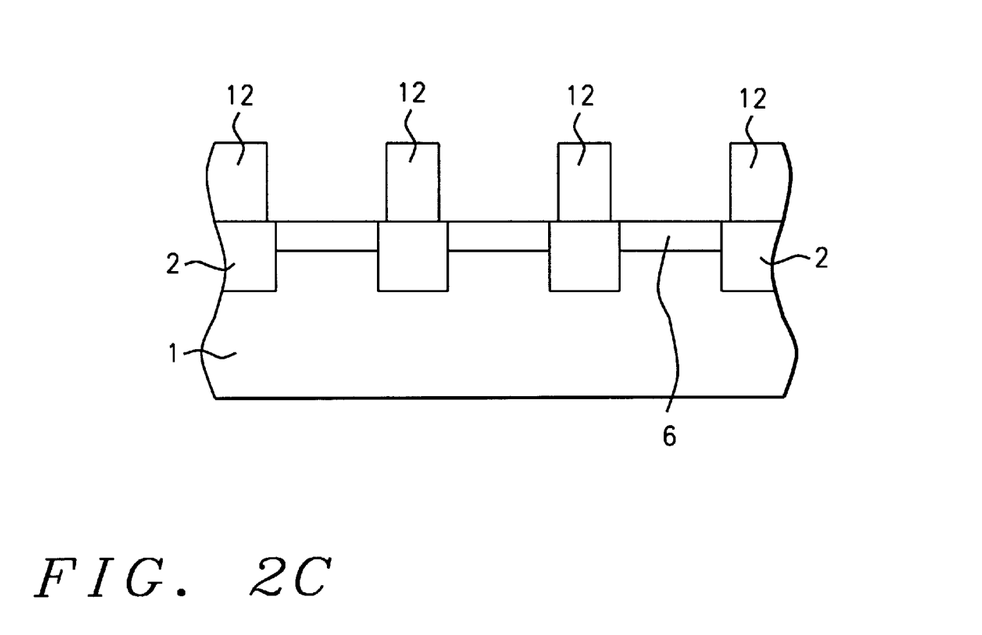

A silicon oxide layer is next deposited, to a thickness between about 2000 to 8000 Angstroms, via LPCVD or PECVD procedures. A CMP procedure is used for planarization purposes, resulting in a smooth top surface topography for the silicon oxide layer. Conventional photolithographic and RIE procedures, using $CHF_3$ as an etchant, are used to pattern the planarized silicon oxide layer, forming silicon oxide shapes 12, directly overlying shallow trench isolation regions 2. This is schematically shown in cross-sectional style, in FIG. 2C, while a top view of silicon oxide shapes 12, is schematically shown in FIG. 2A. FIG. 2B, schematically, in cross-sectional style, shows a view of silicon oxide shape 12, covering, and filling the spaces between, silicon nitride encapsulated, word line structures 8–11. The photoresist shapes used to define silicon oxide shapes 12, are removed via plasma oxygen ashing and careful wet cleans.

Figure 3A:
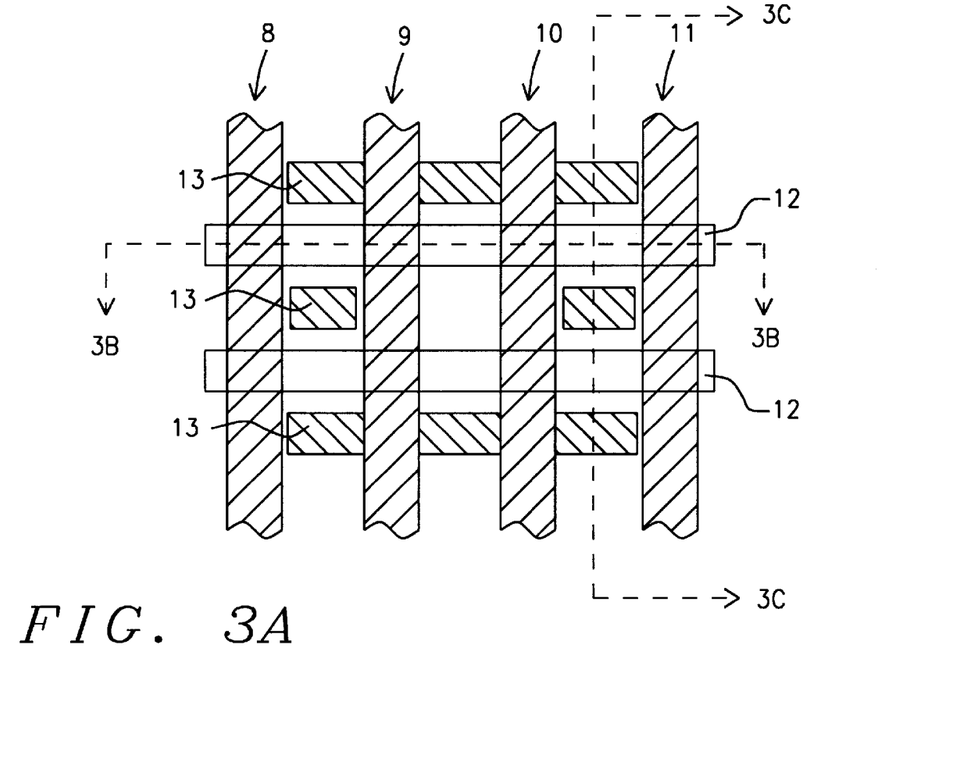
Figure 3B:
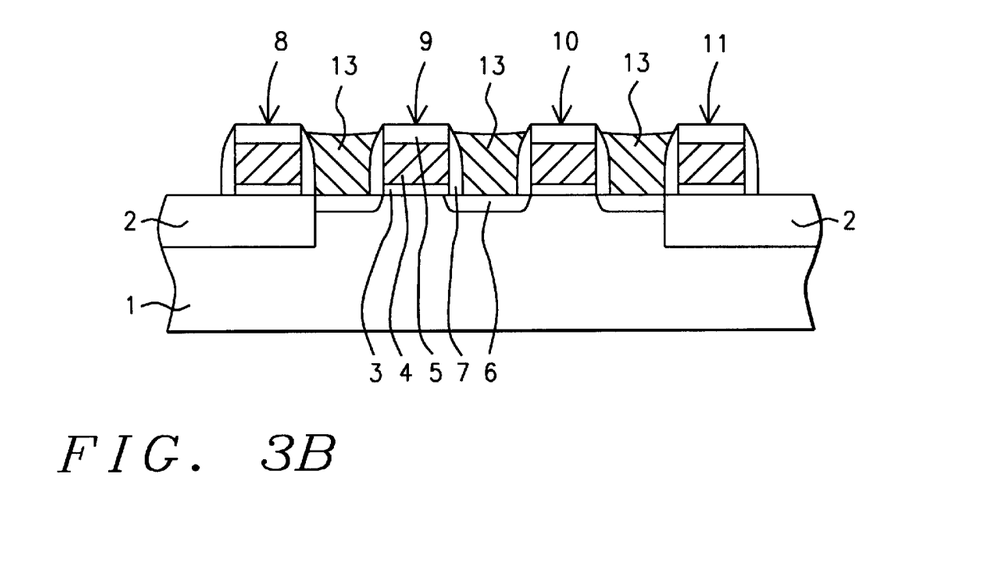
Figure 3C:
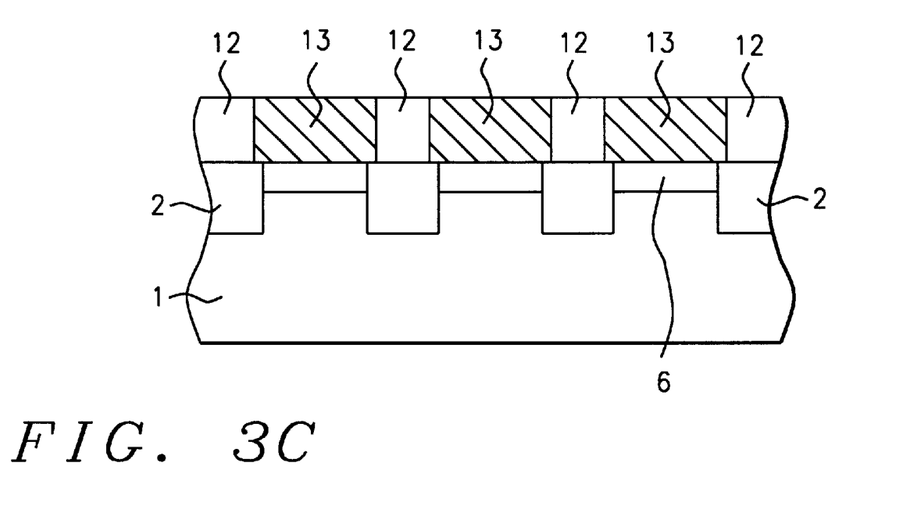

A polysilicon layer is next deposited, via LPCVD procedures, at a thickness between about 2000 to 6000 Angstroms. The polysilicon layer can be doped in situ, during deposition, via the addition of arsine, or phosphine, to a silane ambient, or the polysilicon layer can be deposited intrinsically, then doped via the ion implantation of arsenic, or phosphorous ions. A CMP procedure is then employed to remove the regions of the polysilicon layer residing on the top surface of silicon nitride capping layer 5, on word line structures 8–11, as well as from the top surface of silicon oxide shapes 12, resulting in first polysilicon plug structures 13, shown schematically, in cross-sectional style, in FIG. 3B, located between silicon nitride encapsulated, word line structures 8–11, overlying and contacting lightly doped source/drain regions 6. The CMP procedure also results in the formation of first polysilicon plug structures 13, shown schematically, in cross-sectional style, in FIG. 3C, located between silicon oxide shapes 12, again overlying and contacting lightly doped source/drain regions 6. FIG. 3A, schematically shows a top view of first polysilicon plug structures 13, located between the word lines, and between silicon oxide shapes 12.

Figure 4A:
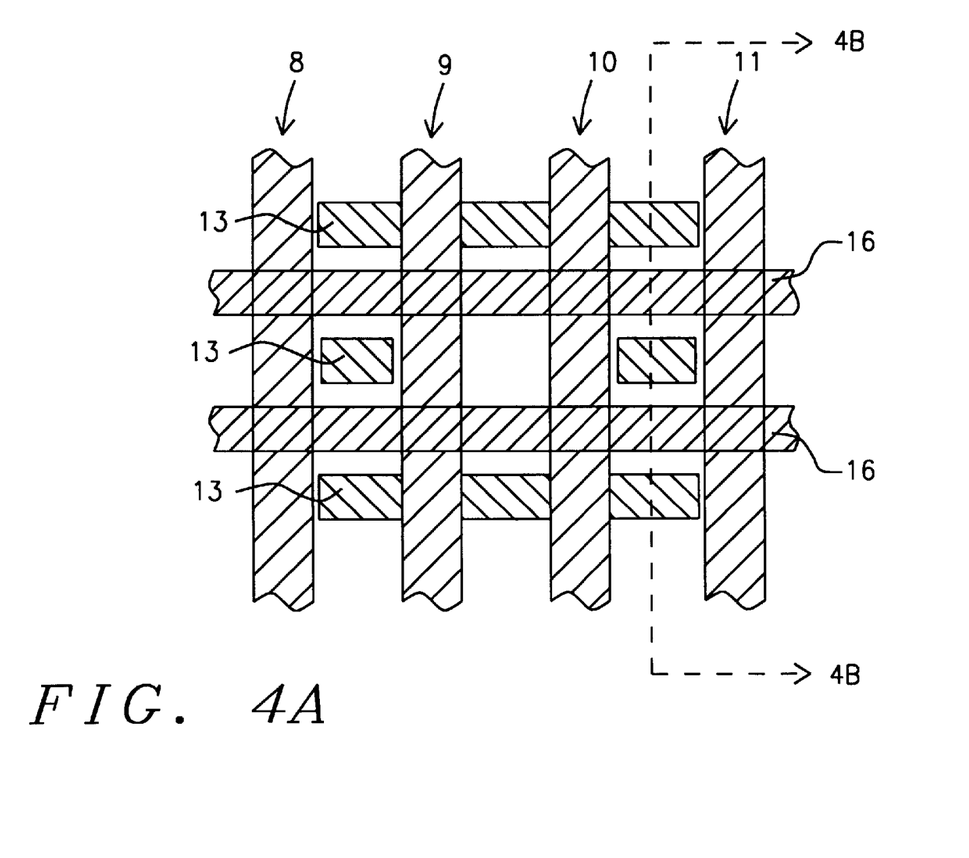
Figure 4B:
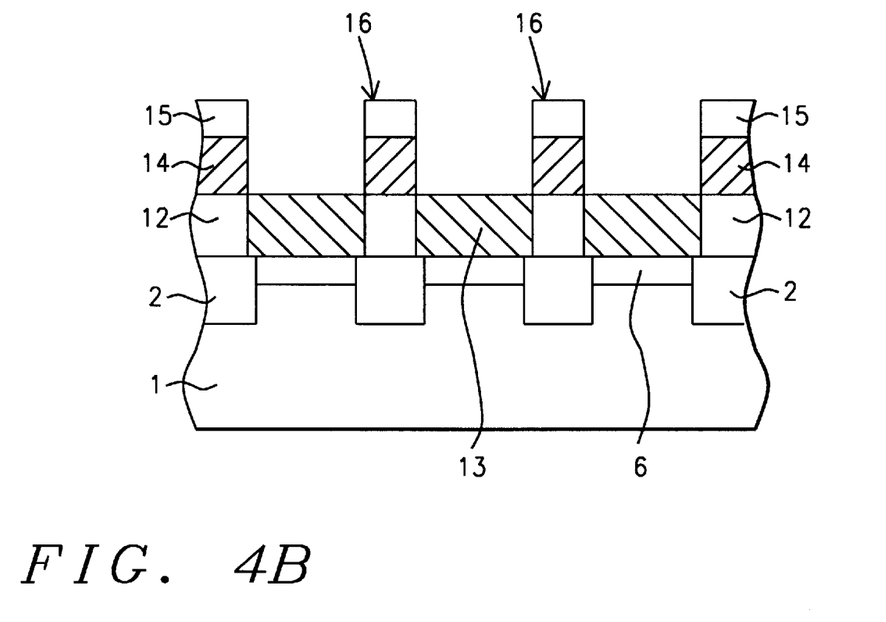

The fabrication of bitline structures 16, are next addressed and shown schematically, in cross-sectional style in FIG. 4B, and shown as a top view in FIG. 4A. Bitline structures 16, are comprised of either a doped polysilicon layer, a tungsten layer, a tungsten silicide layer, or a polycide layer 14, (metal silicide on polysilicon). Any of these layers can be obtained via LPCVD procedures, at a thickness between about 500 to 4000 Angstroms. For the polysilicon option, doping is obtained either via an in situ doping procedure, via the addition of arsine, or phosphine, to a silane ambient, or via ion implantation of arsenic, or phosphorous, in an intrinsically deposited polysilicon layer 14. A silicon nitride layer 15, is then deposited on underlying conductive layer 14, via LPCVD or PECVD procedures, at a thickness between about 500 to 3000 Angstroms. Conventional photolithographic and RIE procedures, using $CF_4$ as an etchant for silicon nitride layer 15, and using $Cl_2$ as an etchant for conductive layer 14, are used to create bitline structures 16, shown schematically in FIG. 4A, normal in direction to word lines 8–11, and overlying silicon oxide shapes 12, for the cross-sectional representation, in FIG. 4B. The photoresist shape, used to define bitline structures 16, is removed using plasma oxygen ashing and careful wet cleans.

Figure 5A:
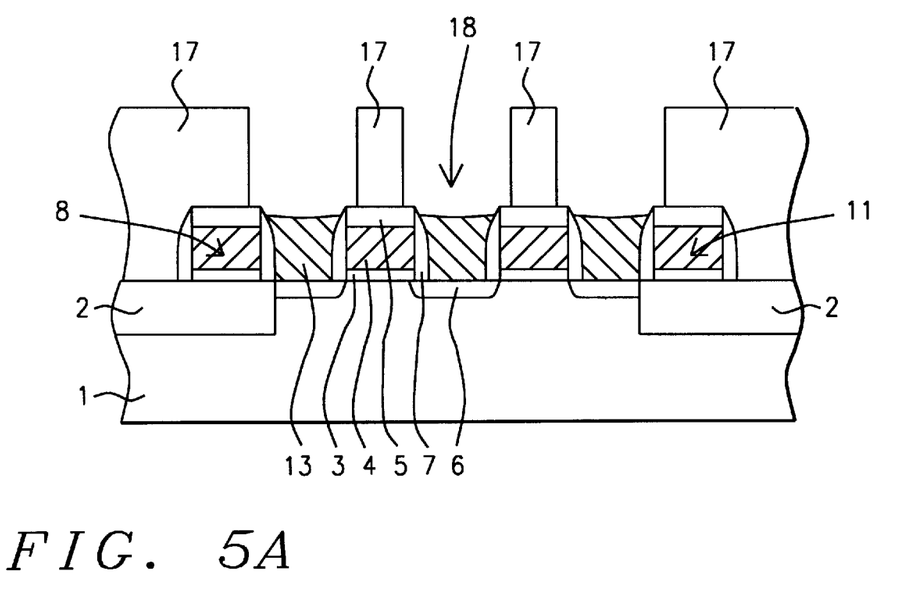
Figure 5B:
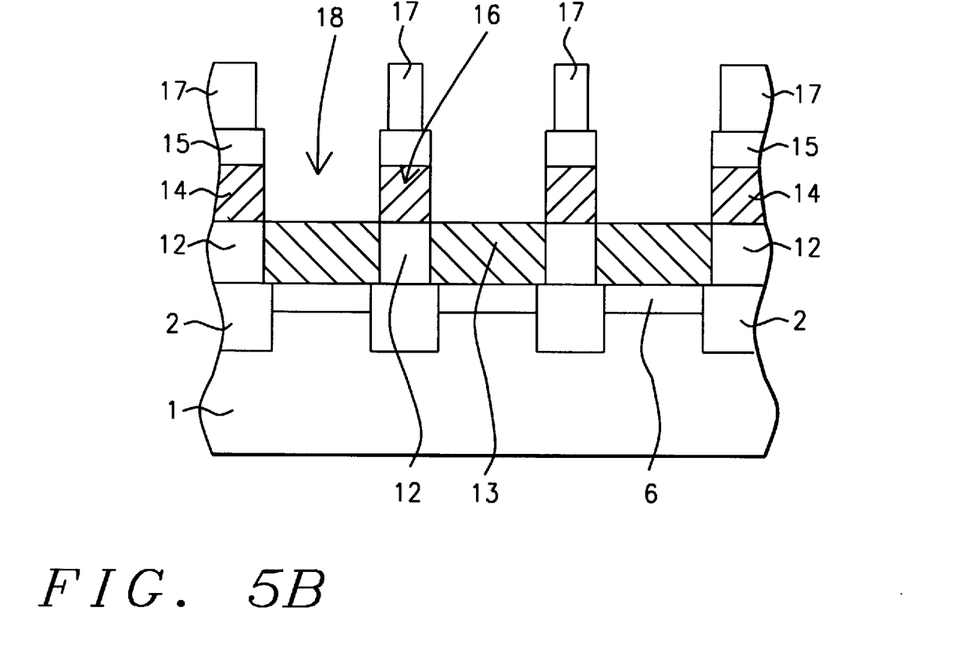

Silicon oxide layer 17, is next deposited, via PECVD or LPCVD procedures, at a thickness between about 2000 to 8000 Angstroms, completely filing thee spaces between bitline structures 16. A CMP procedure is then employed to create a smooth top surface topography for silicon oxide layer 17. The critical self-aligned contact, (SAC), openings 18, is next formed in planarized silicon oxide layer 17, and schematically shown in FIGS. 5A and 5B. A photoresist shape, with an opening greater in width than the space between bitline structures 16, and greater in width than the space between word line structures 8–11, is used to selectively create SAC openings 18. An anisotropic, selective RIE procedure, using $CHF_3$ as an etchant for silicon oxide, creates SAC opening 18, through, or between bitline structures 17, exposing the top surface of first polysilicon plug structures 13. The high etch rate ratio of silicon oxide to exposed silicon nitride layer 15, between about 25 to 1, or to first polysilicon plug structure 13, of between about 20 to 1, allowed SAC openings 18, to be selectively formed. This is schematically shown in FIG. 5B. FIG. 5A, schematically shows SAC openings 18, exposing the top surface of polysilicon plug structures 13, between word line structures 8–11. The photoresist shape used to create SAC openings 18, is again removed via plasma oxygen ashing and careful wet cleans. It should be noted that the SAC openings were formed prior to formation of insulator spacers, on the exposed sidewall of the bitline structures, thus avoiding damage to the insulator spacers, during the RIE procedure, used for the SAC openings.

Figure 6A:
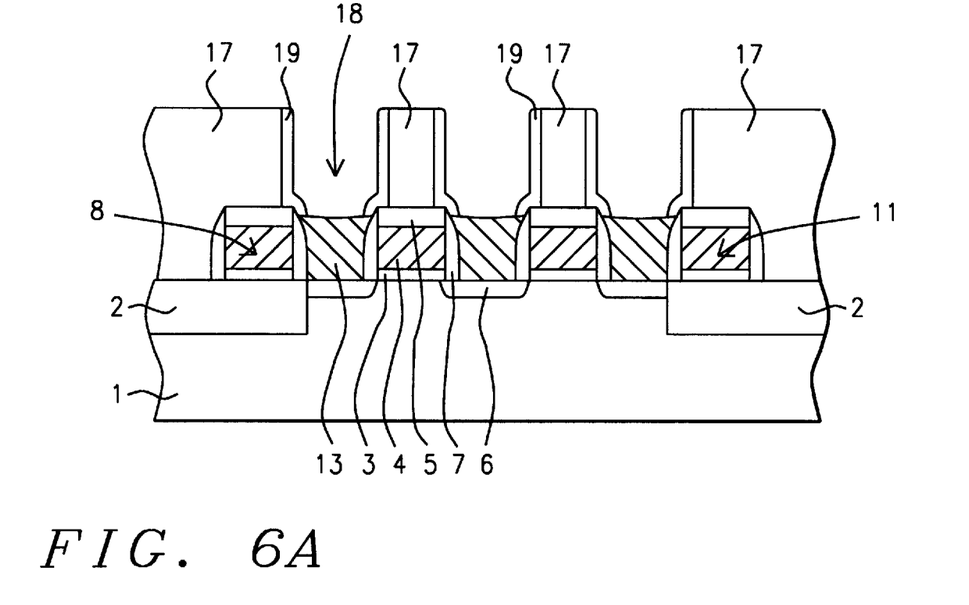
Figure 6B:
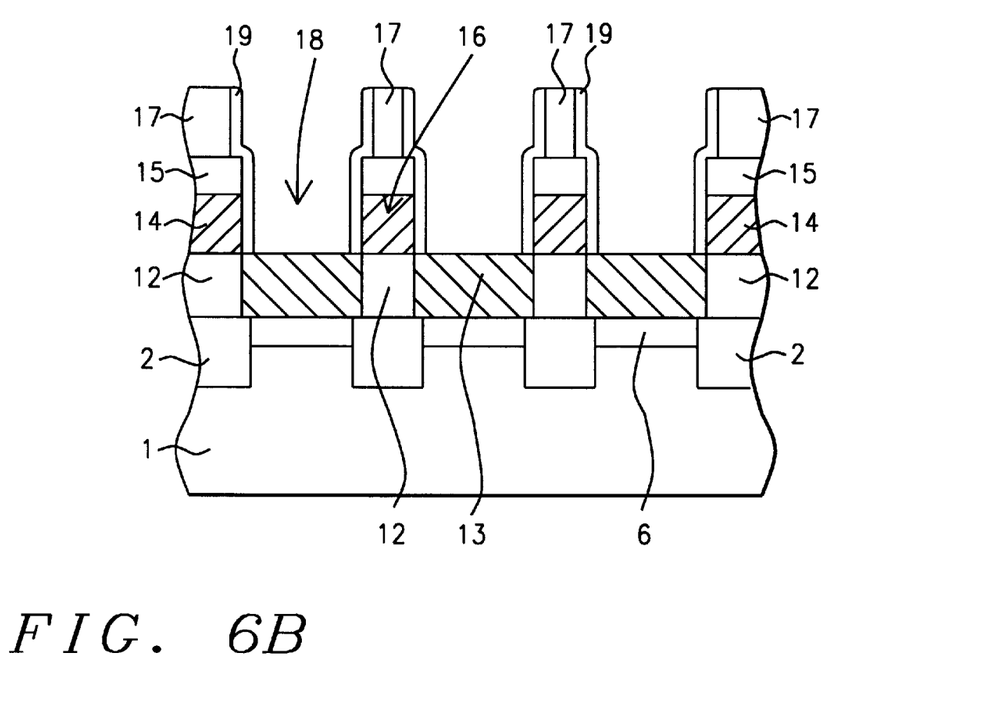

The creation of the critical insulator spacers, on the sidewall of the bitline structures, is next addressed, and schematically shown in FIGS. 6A and 6B. A silicon oxide layer is next deposited, via PECVD or LPCVD procedures, at a thickness between about 300 to 2000 Angstroms. An anisotropic RIE procedure, using $CHF_3$ as an etchant, is next performed resulting in silicon oxide spacers 19, formed on the sides of silicon nitride capped, bit line structures 16, schematically shown in FIG. 6B, and on the sides of silicon oxide shapes 17, overlying word line structures 8–11, schematically shown in FIG. 6A. If desired a composite silicon oxide—silicon nitride, spacer can be formed. It should however be noted that the use of silicon oxide, as a spacer, results in less capacitance between the bitline structure, and a subsequent capacitor structure, when compared to counterpart spacers, formed from silicon nitride layers. The use of silicon oxide was made possible by forming the SAC opening, prior to spacer formation. If the SAC opening were formed after spacer formation, silicon nitride spacers would have been needed to provide the etch selectivity between silicon oxide layer 17, and the spacer material.

Figure 7A:
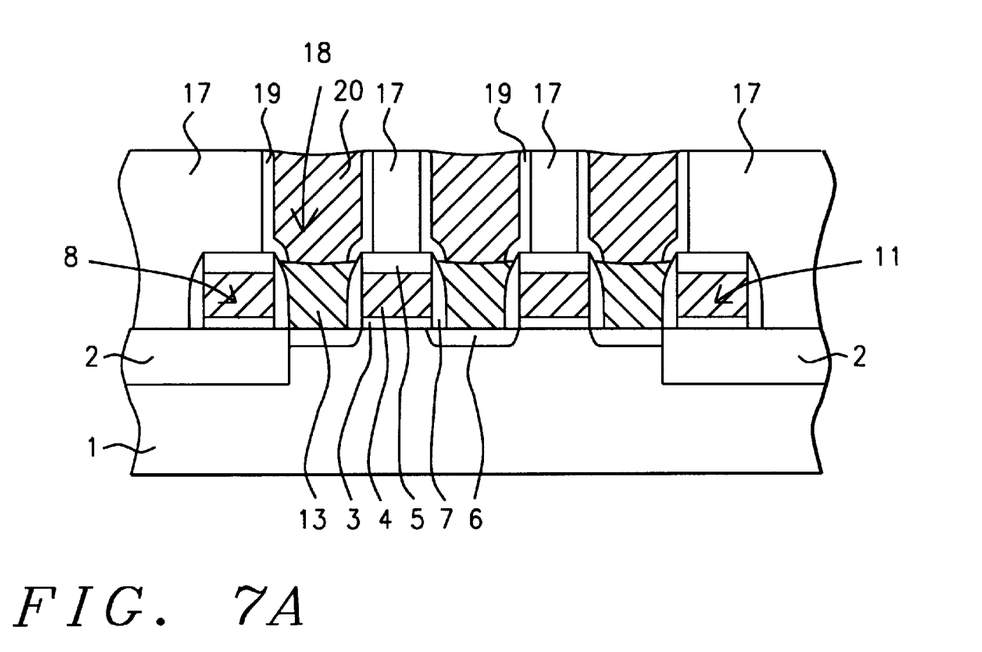
Figure 7B:
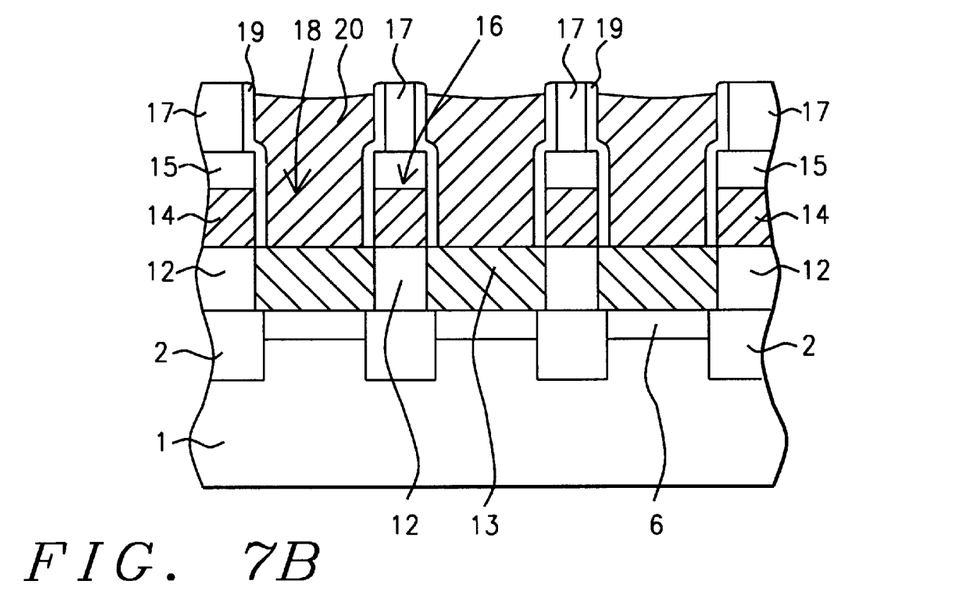
Figure 8:
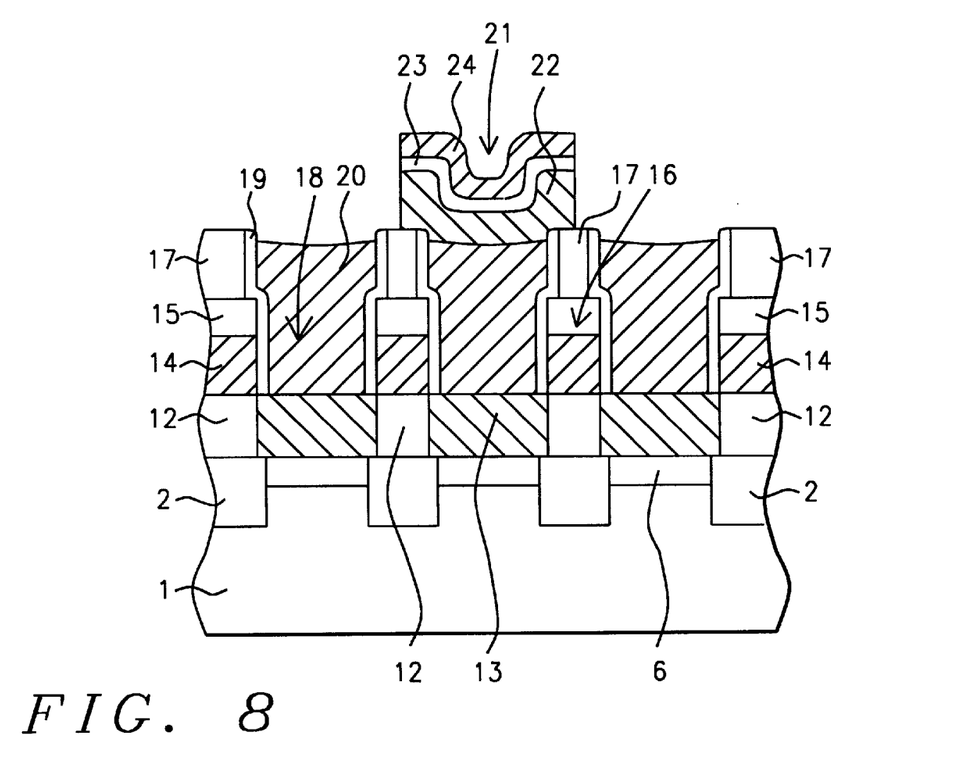

The creation of second polysilicon plug structures 20, in SAC openings 18, is next addressed and shown schematically in FIGS. 7A and 7B. A polysilicon layer is deposited, via LPCVD procedures, to a thickness between about 1000 to 3000 Angstroms, completely filling SAC openings 18. The polysilicon layer is doped in situ, during deposition, via the addition of arsine, or phosphine, to a silane ambient. A CMP procedure is then used to remove polysilicon from the top surface of silicon oxide layer 17, resulting in second polysilicon plug structures 20, in SAC openings 18, overlying, and contacting the top surface of first polysilicon plug structures 13. A capacitor structure 21, shown schematically in FIG. 8, is then formed overlying, and contacting, the top surface of second polysilicon plug structure 20, and thus communicating with source/drain region 6. Capacitor structure 21, can be comprised of a polysilicon storage node structure 22, a capacitor dielectric layer 23, such as $Ta_2O_5$, or ONO, (Oxidized Nitride on Oxide), and an overlying polysilicon upper electrode structure 24. Thus the capacitor over bitline configuration, is accomplished via the storage node contact structure, or second polysilicon plug structure 20, formed through bitline structures 16.

While this invention has been shown and described with reference to, the preferred embodiments thereof, it will be understood by those skilled in the art that various changes in form and details may be made without departing from the spirit or scope of this invention.

What is claimed is:

1. A method of fabricating a capacitor over bitline, (COB), structure, for a dynamic random access memory, (DRAM), device, on a semiconductor substrate, comprising the steps of:

forming isolation regions in a first region of said semiconductor substrate;

forming a gate insulator layer, on a second region of said semiconductor substrate, not occupied by said isolation regions;

forming word line structures, overlying portions of said isolation regions, and overlying portions of said gate insulator layer;

forming source/drain regions, in a region of said semiconductor substrate, not covered by said word line structures, or by said isolation regions;

forming insulator shapes on said isolation regions;

forming lower polysilicon plug structures, between said insulator shapes, and between word line structures, overlying, and contacting said source/drain regions;

forming bitline structures, on said insulator shapes;

forming a planarized insulator layer on underlying, said bitline structures, and on underlying, lower polysilicon plug structures, completely filling spaces between said bitline structures;

forming self-aligned contact, (SAC), openings, in said planarized insulator layer, and through said bitline structures, exposing the sidewall of said bitline structures, and exposing the top surface of said lower polysilicon plug structures;

forming insulator spacers on the sides of said planarized insulator layer, and on the sides of said bitline structures, exposed in said SAC openings:

forming upper polysilicon plug structures, in said SAC openings, overlying and contacting the top surface of said lower polysilicon plug structures; and forming a capacitor structure, overlying and contacting, said upper polysilicon plug structure.

2. The method of claim 1, wherein said isolation regions, are silicon oxide filled, shallow trench regions, formed via the etching shallow trenches, in said semiconductor substrate, filling the shallow trenches with a silicon oxide layer, obtained via LPCVD or PECVD procedures, then removing unwanted regions of the silicon oxide layer, via a chemical mechanical polishing procedure.

3. The method of claim 1, wherein said gate insulator layer is comprised of silicon dioxide, obtained via thermal oxidation procedures, at a thickness between about 20 to 80 Angstroms.

4. The method of claim 1, wherein said word line structures, are comprised of polysilicon, obtained via LPCVD procedures, at a thickness between about 800 to 4000 Angstroms, and doped either in situ, during deposition, via the addition of arsine, or phosphine, to a silane ambient, or doped via an ion implantation procedure, using arsenic, or phosphorous ions, applied to an intrinsically deposited polysilicon layer.

5. The method of claim 1, wherein said insulator shapes, are silicon oxide shapes, formed from a silicon oxide layer, obtained via LPCVD or PECVD procedures, at a thickness between about 2000 to 8000 Angstroms, then defined via an anisotropic RIE procedure, using $CHF_3$ as an etchant.

6. The method of claim 1, wherein said lower polysilicon plug structures are formed from deposition of a polysilicon layer, via LPCVD procedures, at a thickness between about 2000 to 6000 Angstroms, doped in situ, during deposition via the addition of arsine, or phosphine, to a silane ambient, then defined via a chemical mechanical polishing procedure.

7. The method of claim 1, wherein said bitline structures, are comprised of polysilicon, formed from a polysilicon layer, obtained via LPCVD procedures, at a thickness between about 500 to 4000 Angstroms, and either doped in situ, during deposition, via the addition of arsine, or phosphine, to a silane ambient, or doped via ion implantation of arsenic, or phosphorous ions, into an intrinsically deposited polysilicon layer.

8. The method of claim 1, wherein said bitline structures, are comprised of either tungsten, tungsten silicide, or a polycide layer, such as tungsten silicide on polysilicon, obtained via LPCVD procedures, at a thickness between about 500 to 4000 Angstroms.

9. The method of claim 1, wherein said planarized insulator layer is a silicon oxide layer, obtained via LPCVD or PECVD procedures, at a thickness between about 2000 to 8000 Angstroms, then planarized via a chemical mechanical polishing procedure.

10. The method of claim 1, wherein said self-aligned contact openings are formed in said planarized insulator layer, via an anisotropic RIE procedure, using $CHF_3$ as an etchant, with an etch rate ratio of said planarized insulator layer, to silicon nitride, of about 25 to 1, and with an etch rate ratio of planarized insulator layer, to polysilicon, of about 20 to 1.

11. The method of claim 1, wherein said insulator spacers, are formed from a silicon oxide layer, obtained via LPCVD or PECVD procedures, at a thickness between about 300 to 2000 Angstroms, followed by an anisotropic RIE procedure, using $CHF_3$ as an etchant.

12. The method of claim 1, wherein said upper polysilicon plug structures are formed from a polysilicon layer, obtained via LPCVD procedures, at a thickness between about 1000 to 3000 Angstroms, doped in situ, during deposition, via the addition of arsine, or phosphine, to a silane ambient, then defined via removal of unwanted polysilicon, via a chemical mechanical polishing procedure.

13. A method of fabricating a capacitor over bitline, DRAM device, on a semiconductor substrate, featuring the formation of self-aligned contact, (SAC), openings, through bitline structures, and featuring insulator spacers, on the sides of the bitline structures, formed after the creation of the SAC openings, comprising the steps of:

forming rows of silicon oxide filled, shallow trench regions, in said semiconductor substrate;

growing a silicon dioxide gate insulator layer, on regions of said semiconductor substrate not covered by silicon oxide filled, shallow trench regions;

forming rows of silicon nitride encapsulated, word line structures, normal in direction to said rows of silicon oxide filled, shallow trench regions, with each silicon nitride encapsulated, word line structure, overlying regions of said silicon dioxide gate insulator layer, and overlying regions of said silicon oxide filled shallow trench regions;

forming source/drain regions, in a region of said semiconductor substrate not covered by said silicon nitride encapsulated, word line structures, or by said silicon oxide filled, shallow trench regions;

forming silicon oxide shapes, on an area of said silicon oxide filled, shallow trench regions, not covered by said silicon nitride encapsulated, word line structures;

depositing a first polysilicon layer;

performing a first chemical mechanical polishing procedure, to remove the regions of said first polysilicon layer, located on the top surface of said silicon oxide shapes, forming lower polysilicon plug structures, between said silicon oxide shapes, and between said silicon nitride encapsulated, word line structures, overlying, and contacting said source/drain regions;

forming silicon nitride capped, bitline structures, on said silicon oxide shapes;

depositing a silicon oxide layer, completely filling the spaces between said silicon nitride capped, bitline structures;

performing a second chemical mechanical polishing procedure, to planarize the top surface of said silicon oxide layer;

forming said SAC openings, in said silicon oxide layer, exposing the sidewall of said silicon nitride capped, bitline structures, and exposing the top surface of said lower polysilicon plug structure;

forming insulator spacers on the sidewall of said bitline structure, exposed in said SAC openings;

depositing a second polysilicon layer, completely filling said SAC openings;

performing a third chemical mechanical polishing procedure, removing regions of said second polysilicon layer, from the to surface of said silicon oxide layer, creating upper polysilicon plug structures, directly overlying said lower polysilicon plug structures; and forming a capacitor structure on the top surface of said silicon oxide layer, and overlying and contacting said upper polysilicon plug structure.

14. The method of claim 13, wherein said silicon oxide gate insulator layer is obtained via thermal oxidation procedures, at a thickness between about 20 to 80 Angstroms.

15. The method of claim 13, wherein said silicon nitride encapsulated, word line structures are formed from an underlying, polysilicon layer, obtained via LPCVD procedures, at a thickness between about 800 to 4000 Angstroms, doped in situ, via the addition of arsine, or phosphine, to a silane ambient, and formed from an overlying silicon nitride layer, obtained via LPCVD or PECVD procedures, at a thickness between about 500 to 3000 Angstroms.

16. The method of claim 13, wherein said silicon nitride encapsulated, word line structures, are formed from an underlying polycide layer, such as tungsten silicide, obtained via LPCVD procedures, at a thickness between about 500 to 3000 Angstroms, and formed from an overlying layer of silicon nitride, obtained via LPCVD or PECVD procedures, at a thickness between about 500 to 3000 Angstroms.

17. The method of claim 13, wherein said silicon nitride encapsulated, word line structures, are comprised with silicon nitride spacers, located on the sides of said silicon nitride encapsulated, word line structure, with the silicon nitride spacers formed from deposition of a silicon nitride layer, via LPCVD or PECVD procedures, followed by an anisotropic RIE procedure, using $CF_4$ as an etchant.

18. The method of claim 13, wherein said silicon oxide shapes are formed from a silicon oxide layer, obtained via LPCVD or PECVD procedures, at a thickness between about 2000 to 8000 Angstroms.

19. The method of claim 13, wherein said silicon nitride capped, bitline structures, are comprised of an overlying silicon nitride shape, on an underlying polysilicon shape, with the polysilicon shape formed from a polysilicon layer, obtained via LPCVD procedures, at a thickness between about 500 to 4000 Angstroms, and doped in situ, during deposition, via the addition of arsine, or phosphine, to a silane ambient.

20. The method of claim 13, wherein said silicon nitride capped, bitline structures, are comprised of an overlying silicon nitride shape, and of an underlying tungsten silicide shape, with the tungsten silicide shape formed from a tungsten silicide layer, obtained via LPCVD procedures, at a thickness between about 500 to 4000 Angstroms.

21. The method of claim 13, wherein said SAC openings are formed in said silicon oxide layer, via an anisotropic RIE procedure, using $CHF_3$ as an etchant, with an etch rate ratio of silicon oxide to silicon nitride, of about 25 to 1, and with an etch rate ratio of silicon oxide to polysilicon, of about 20 to 1.

22. The method of claim 13, wherein said insulator spacers, on the sides of said bitline structures, are silicon oxide spacers, obtained via deposition of a silicon oxide layer, via LPCVD or PECVD procedures, followed by an anisotropic RIE procedure, using $CHF_3$ as an etchant.

23. A capacitor over bitline, (COB), dynamic random access memory, (DRAM), device structure, on a semiconductor substrate, comprising:

rows of insulator filled, shallow trench regions, in said semiconductor substrate;

a gate insulator layer in regions of said semiconductor substrate, not occupied by said insulator filled, shallow trench regions;

rows of silicon nitride encapsulated, word line structures, located in a direction normal to the direction of said rows of insulator filled, shallow trench regions, with said rows of silicon nitride encapsulated, word line structures, overlying areas of said insulator filled, shallow trench regions, and overlying portions of said gate insulator layer;

source/drain regions, in areas of said semiconductor substrate, not covered by silicon nitride encapsulated, word line structures, or by insulator filled, shallow trench regions;

rows of insulator shapes, directly overlying said rows of insulator filled, shallow trench regions;

lower polysilicon plug structures, overlying said source/drain regions, and located between said rows of insulator shapes, and between said rows of silicon nitride encapsulated, word line structures;

silicon nitride capped, bitline structures, located on said rows of insulator shapes;

openings in a planarized silicon oxide layer, exposing the sides of said silicon nitride capped, bitline structures, and exposing the top surface of said lower polysilicon plug structures;

insulator spacers on the sides of said silicon nitride capped, bitline structures;

upper polysilicon plug structures, in said openings, in said planarized silicon oxide layer, overlying and contacting the top surface of said lower polysilicon plug structures; and a capacitor structure, overlying and contacting, an upper polysilicon plug structure.

24. The COB DRAM device structure of claim 23, wherein said rows of insulator filled, shallow trench regions, are comprised of silicon oxide filled, shallow trench regions.

25. The COB DRAM device structure of claim 23, wherein the silicon nitride encapsulated, word line structures, are comprised of an silicon nitride shape, at a thickness between about 500 to 3000 Angstroms, comprised of an underlying polysilicon shape, at a thickness between about 800 to 4000 Angstroms, and comprised with silicon nitride spacers located on the sides of the silicon nitride encapsulated, word line structures.

26. The COB DRAM structure of claim 23, wherein the silicon nitride capped, bitline structures, are comprised of a silicon nitride shape, at a thickness between about 500 to 3000 Angstroms, overlying either a polysilicon, a tungsten, or tungsten silicide shape, at a thickness between about 500 to 4000 Angstroms.

27. The COB DRAM device structure of claim 23, wherein said opening, in said planar silicon oxide layer, is a self-aligned contact, (SAC), opening, located between said silicon nitride capped, bit line structures, with the sides of said silicon nitride capped, bitline structures, exposed in the SAC opening.

28. The COB DRAM device structure of claim 23, wherein said insulator spacers, on the sidewall of said silicon nitride capped, bitline structures, are comprised of silicon oxide, at a thickness between about 300 to 2000 Angstroms.

* * * * *